United States Patent
Bour et al.

(10) Patent No.: US 7,033,938 B2
(45) Date of Patent: *Apr. 25, 2006

(54) METHOD OF MAKING A LONG WAVELENGTH INDIUM GALLIUM ARSENIDE NITRIDE (INGAASN) ACTIVE REGION

(76) Inventors: David P. Bour, 11092 Bel Aire Ct., Cupertino, CA (US) 95014; Tetsuya Takeuchi, 999 Evelyn Ter. West, #2, Sunnyvale, CA (US) 94086; Ashish Tandon, 927 Robin Way, Sunnyvale, CA (US) 94087; Ying-Lan Chang, 8099 Presidio Dr., Cupertino, CA (US) 95014; Michael R. T. Tan, 315 Cotton St., Menlo Park, CA (US) 94025; Scott W. Corzine, 1354 Egret Dr., Sunnyvale, CA (US) 94087

( * ) Notice: This patent issued on a continued prosecution application filed under 37 CFR 1.53(d), and is subject to the twenty year patent term provisions of 35 U.S.C. 154 (a)(2).

Subject to any disclaimer, the term of this patent is extended or adjusted under 35 U.S.C. 154(b) by 56 days.

This patent is subject to a terminal disclaimer.

(21) Appl. No.: 10/785,747

(22) Filed: Feb. 23, 2004

(65) Prior Publication Data
US 2004/0219703 A1    Nov. 4, 2004

Related U.S. Application Data

(63) Continuation-in-part of application No. 10/140,625, filed on May 7, 2002, now Pat. No. 6,756,325.

(51) Int. Cl.
*H01L 21/44* (2006.01)

(52) U.S. Cl. .............. 438/681; 438/477; 438/507; 438/604

(58) Field of Classification Search ............. 438/46, 438/47, 57, 73, 93, 94, 478, 503, 506, 936, 438/938, 956, 962, 477, 507, 604, 681
See application file for complete search history.

(56) References Cited

U.S. PATENT DOCUMENTS

| | | | |
|---|---|---|---|
| 5,719,895 A * | 2/1998 | Jewell et al. | 372/45 |
| 5,888,840 A * | 3/1999 | Kudo | 438/31 |
| 5,944,913 A | 8/1999 | Hou et al. | |
| 6,150,677 A * | 11/2000 | Tanaka et al. | 257/201 |

(Continued)

OTHER PUBLICATIONS

Kondow et al., "A 1.3um GaInNas Laser Diode with a Lifetime of over 1000 hours" Jpn. J. Appl. Phys., vol. 38(1999, pp. L1355-L1356.

(Continued)

*Primary Examiner*—Michael Trinh
*Assistant Examiner*—Khanh Duong

(57) ABSTRACT

The active region of a long-wavelength light emitting device is made by providing an organometallic vapor phase epitaxy (OMVPE) reactor, placing a substrate wafer capable of supporting growth of indium gallium arsenide nitride in the reactor, supplying a Group III–V precursor mixture comprising an arsenic precursor, a nitrogen precursor, a gallium precursor, an indium precursor and a carrier gas to the reactor and pressurizing the reactor to a sub-atmospheric elevated growth pressure no higher than that at which a layer of indium gallium arsenide layer having a nitrogen fraction commensurate with light emission at a wavelength longer than 1.2 μm is deposited over the substrate wafer.

22 Claims, 5 Drawing Sheets

U.S. PATENT DOCUMENTS

| | | |
|---|---|---|
| 6,198,112 B1 | 3/2001 | Ishida et al. |
| 6,207,973 B1 | 3/2001 | Sato et al. |
| 6,284,583 B1 * | 9/2001 | Saida et al. ................. 438/216 |
| 6,382,800 B1 | 5/2002 | Sato |
| 6,764,928 B1 * | 7/2004 | Ohtani ....................... 438/477 |

OTHER PUBLICATIONS

Kitatano et al., "A 1.3um GaInNAs/GaAs Single-Quantum-Well Laser Diode with a High Characteristic Temperature over 200K", Jpn. J. Appl. Physl vol. 39 (2000), pp. L86-L87.

Sato, "Low Threshold and High Characteristic Temperature 1.3 um Range GaInNAs Lasers grown by Metalorganic Chemical Vapor Deposition", Jpn. J. Appl. Phys, vol. 39 (2000) pp. 3403-3405.

Asai and Dandy, "Thermodynamic Analysis of III-V Semiconductor Alloys Grown y Metalorganic Vapor Phase Epitaxy", Journal of Applied Physics, vol. 88, No. 7, Oct. 1, 2000, pp. 4407-4416.

Piner et al, "Effect of Hydrogen on the Indium Incorporation in InGaN Epitaxial Films", Appl. Phys Lett (70) Jan. 27, 1997, American Institute of Physics, pp. 461-463.

Kondow et al., "GaInNAs: A Novel Material for Long-Wavelength Semiconductor Lasers", IEEE J. of Selected Topics in Quantum ELectronics, vol. 3, No. 3, Jun. 1997, pp. 719-730.

Nakahara et al., "1.3um Continuous-Wave Lasing Operating on GaInNAs Quantum-Well Lasers", IEEE Photonics Technology Letters, Nol. 10 No. 4, Apr. 1998, pp. 487-488.

Kondow et al., "Gas-Source MBE of GaInNAs for Long Wavelength Laser diodes", Journal of Crystal Growth 188 (1988) pp. 255-259.

Miyamoto et al., GaNAs/GaInAs Short-Period Superlattice Quantum Well Structures Grown by MOCVD Using TBAs and DMHy Journal of Crystal Growth 195, 1998, pp. 421-426.

Friedman et al., "Nonlinear Dependence of N Incorporation on In Content of GaInNAs" Journal of Crystal Growth 195 (1998) pp. 438-443.

Ougazzaden et al. "High-Quality InGaAsN Growth by Metalorganic Vapor-Phase Epitaxy using Nitrogen Carrier Gas and Dimethylhydrazine, Tertiarybutylarsine as Group V Precursors" Jpn. J. Appl. Phys. vol. 38(1999), pp. 1019-1021.

Sato and Satoh, "Room-Temperature Continuous-Wave Operations of 1.24um GaInNAs Lasers Grown by Metal Organic Chemical Vapor Deposition", IEEE Journal of Selected Topics in Quantum Electronics, vol. 5, No. 3, May/Jun. 1998.

* cited by examiner

METHOD OF MAKING A LONG WAVELENGTH INDIUM GALLIUM ARSENIDE NITRIDE (INGAASN) ACTIVE REGION

RELATED APPLICATION

This application is a Continuation-in-Part of U.S. patent application Ser. No. 10/140,625 filed May 7, 2002 now U.S. Pat. No. 6,756,325, of David P. Bour et al. entitled Method Of Producing A Long Wavelength Indium Gallium Arsenide Nitride (InGaAsN) Active Region filed on 7 May 2002, the disclosure of which is incorporated into this application by reference.

BACKGROUND

Light emitting devices are used in many applications including optical communication systems. Optical communication systems continue to increase in use due to the large bandwidth they provide for transporting information signals such as voice and data signals. Optical communication systems provide a broad bandwidth and high speed and are suitable for efficiently communicating information signals at high data rates over long distances. Over long distances, optical communication systems operate at relatively long wavelengths, in the order of 1.3 micrometers ($\mu$m) to 1.55 $\mu$m, because optical fibers generally have their lowest attenuation in this wavelength range. These long-wavelength optical communication systems have one or more light sources capable of emitting light at a wavelength in this relatively long wavelength range. In many optical communication systems, the light source is a vertical-cavity surface-emitting laser (VCSEL), although other types of light sources can alternatively be used.

VCSELs operating at the long wavelengths used for optical fiber communication have an active region composed in part of one or more quantum well layers of indium gallium arsenide nitride (InGaAsN). This material allows the operating wavelength of the VCSEL to be extended to approximately 1.3 $\mu$m. Furthermore, it is predicted that active regions composed in part of quantum well layers of InGaAsN will provide excellent performance characteristics in other applications using photonic devices, such as light emitting diodes (LEDs), edge-emitting lasers, and vertical-cavity surface-emitting lasers (VCSELs). These excellent performance characteristics are a consequence of the strong electron confinement provided by AlGaAs heterostructures that provide carrier and optical confinement in both edge-emitting and surface-emitting devices. In both edge-emitting and surface-emitting lasers, active regions incorporating quantum well layers of InGaAsN provide performance benefits. InGaAsN therefore has the potential to be a viable substitute for indium gallium arsenide phosphide (InGaAsP) in 1.3 $\mu$m lasers.

Molecular beam epitaxy (MBE) is conventionally used to form layers of InGaAsN. MBE uses a nitrogen radical generated by a plasma source as a source of active nitrogen species. The purity of the nitrogen provided by MBE is typically high because high-purity nitrogen gas is widely available. Further, using MBE, the incorporation efficiency of nitrogen into the epitaxial layer approaches unity. However, MBE suffers from a low growth rate, resulting in a long growth time. Moreover, MBE does not scale well, and therefore does not lend itself to high-volume production of light emitting devices.

Another technique for producing semiconductor-based light emitting devices is known as organometallic vapor phase epitaxy (OMVPE), sometimes referred to as metal organic chemical vapor deposition (MOCVD). In OMVPE, a carrier gas is passed through liquid chemical precursors to generate respective chemical vapors that are passed over a heated semiconductor substrate located in a reactor. Conditions in the reactor are controlled so that atomic species released from the chemical vapors passing over the substrate bond to the surface of the substrate to form an epitaxial film.

High quality films of InGaAsN are difficult to grow using OMVPE because the purity of the nitrogen precursor is difficult to control. A typical nitrogen precursor is dimethylhydrazine (DMHy), $[CH_3]_2NNH_2$,. Moreover, the nitrides that partially constitute InGaAsN are somewhat immiscible with the remaining constituents. These factors cause the distribution of nitrogen in the layer to be non-uniform. This results in bandgap fluctuations throughout the layer. The bandgap fluctuations broaden the spontaneous emission spectrum and the gain spectrum, which raises threshold current of the laser.

Furthermore, DMHy does not readily decompose to yield atomic nitrogen. This makes it difficult to grow InGaAsN with a nitrogen fraction sufficient to reduce the band gap of the material to one corresponding to emission at 1.3 $\mu$m. This nitrogen fraction is typically in a design range extending from about 0.2% to about 5%. To achieve a nitrogen fraction greater than a fraction of 1%, the ratio of DMHy to the arsenic precursor, typically arsine ($AsH_3$), is conventionally increased relative to the expected ratio because the arsenic provided by the arsenic precursor competes with the nitrogen released from the DMHy for the available group-V lattice sites. However, reducing the flow of the arsenic precursor tends to reduce the optical quality of the InGaAsN film.

To grow a high-quality InGaAsN layer with a sufficient nitrogen fraction using OMVPE, an extremely high ratio of the dimethylhydrazine flow rate to the total Group V precursor flow rate is used. However, even when the DMHy ratio is raised to 90% or greater, a negligible nitrogen fraction (<<1%) may be obtained, despite the high nitrogen content of the vapor.

The presence of indium in the grown material makes the incorporation of nitrogen even more problematic. Indium-containing material is a necessary component of the quantum well layers of a 1.3 $\mu$m laser diode. Ideally, for 1.3 $\mu$m light emitting devices, the indium fraction should be greater than or equal to about 30%, and the nitrogen fraction should in the above-mentioned design range, i.e., from about 0.2% to about 5%. The longest wavelength that can typically be attained using InGaAs quantum well layers having a maximum indium fraction is about 1.2 $\mu$m. The maximum indium fraction is limited by biaxial compression. Using InGaAsN with a relatively small nitrogen fraction in the above-mentioned design range as the material of the quantum well layers reduces the bandgap energy into a range that extends the wavelength range to 1.3 $\mu$m and beyond. Nevertheless, a nitrogen content of even 1% is difficult to attain using conventional OMVPE, even when the nitrogen precursor exceeds 90% of the total Group V precursors.

Therefore, what is needed is a method in which OMVPE is used to mass produce a high optical quality light emitting device having InGaAsN as the material of its active layer(s).

SUMMARY OF THE INVENTION

The invention provides in a first aspect a method of making the active region of a long-wavelength light emitting device. In the method, an organometallic vapor phase epitaxy (OMVPE) reactor is provided. A substrate wafer capable of supporting growth of indium gallium arsenide nitride is placed in the reactor. A Group III–V precursor mixture comprising an arsenic precursor, a nitrogen precursor, a gallium precursor, an indium precursor and a carrier gas is supplied to the reactor and the reactor is pressurized to a sub-atmospheric elevated growth pressure no higher than that at which a layer of indium gallium arsenide layer having a nitrogen fraction commensurate with light emission at a wavelength longer than 1.2 µm is deposited over the substrate wafer.

The invention provides in a second aspect a method of making the active region of a long-wavelength light emitting device. In the method, an organometallic vapor phase epitaxy (OMVPE) reactor is provided. A substrate wafer capable of supporting growth of indium gallium arsenide nitride is placed in the reactor. A Group III–V precursor mixture comprising an arsenic precursor, a gallium precursor, an indium precursor and a carrier gas is supplied to the reactor. A sublayer of InGaAs is grown. Supply of the Group III–V precursor mixture is discontinued, and a Group V precursor mixture comprising an arsenic precursor and a nitrogen precursor in which the concentration of the nitrogen precursor exceeds that of the arsenic precursor is supplied to the reactor.

The invention provides in a third aspect a method of making the active region of a long-wavelength light emitting device. In the method, an organometallic vapor phase epitaxy (OMVPE) reactor is provided. A substrate wafer is placed in the reactor. A Group III–V precursor mixture comprising an arsenic precursor, a nitrogen precursor, a gallium precursor, an indium precursor and a carrier gas in which the concentration of the nitrogen precursor exceeds the concentration of the arsenic precursor is supplied to the reactor, and the reactor is pressurized to a growth pressure of at least 100 millibars but less than 1000 millibars to grow a layer of indium gallium arsenide nitride.

The invention provides in a fourth aspect a method of making the active region of a long-wavelength light emitting device. In the method, an organometallic vapor phase epitaxy (OMVPE) reactor is provided and a substrate wafer is placed in the reactor. A Group III precursor mixture and a Group V precursor mixture are supplied to the reactor. The Group V precursor mixture comprises a gallium precursor and an indium precursor. The Group V precursor mixture comprises an arsenic precursor and a nitrogen precursor. A layer of indium gallium arsenide nitride having a nitrogen fraction commensurate with light emission at a wavelength longer than 1.2 µm is grown over the substrate wafer. The growing comprises minimizing the concentration of the arsenic precursor consistent with growth of material of high electro-optical quality and maximizing the concentration of the nitrogen precursor in the Group V precursor mixture.

Embodiments of the invention enable the growth of epitaxial layers of InGaAsN having excellent electro-optical properties and a nitrogen fraction in a design range from about 0.2% to about 5%. Such layers can be used to generate light at wavelengths longer than about 1.2 µm.

BRIEF DESCRIPTION OF THE DRAWINGS

The invention, as defined in the claims, can be better understood with reference to the following drawings. The components within the drawings are not necessarily to scale relative to each other. Instead, emphasis is placed upon clearly illustrating the principles of the invention.

DETAILED DESCRIPTION

The invention will be described below with reference to an exemplary embodiment being used to fabricate a vertical-cavity surface-emitting laser (VCSEL) having epitaxial layers of InGaAsN in its active region. However, other embodiments of the method in accordance with the invention can beneficially be used to fabricate other device structures. For example, an edge-emitting laser having one or more high quality epitaxial layers of InGaAsN in its active region can be economically fabricated using other embodiments of the invention.

Figure 1A:
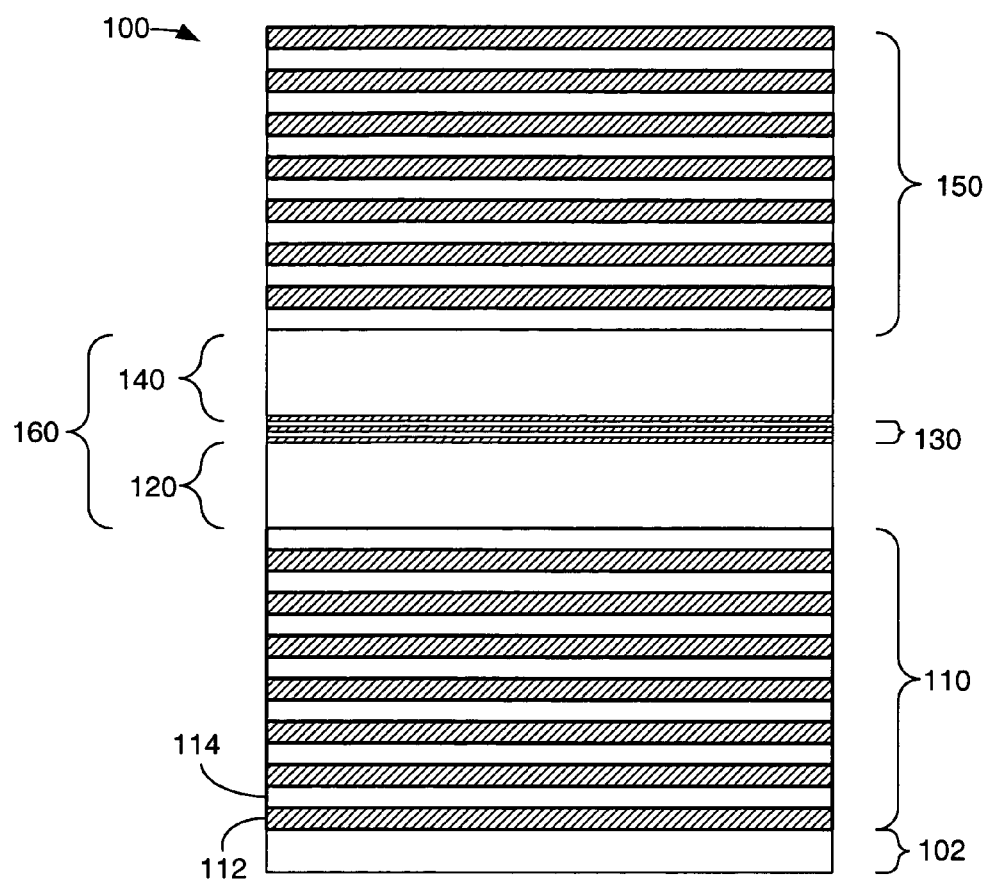
FIG. 1A is a schematic view illustrating an exemplary vertical-cavity surface-emitting laser (VCSEL) fabricated using a method in accordance with the invention.

FIG. 1A is a schematic view illustrating an exemplary vertical-cavity surface-emitting laser (VCSEL) 100 fabricated using an embodiment of a method in accordance with a first aspect of the invention. The VCSEL 100 is composed of an n-type gallium arsenide (GaAs) substrate 102 on which is located an n-type distributed Bragg reflector (DBR) 110. In this example, the DBR 110 is composed of approximately 40 layer pairs each composed of an epitaxial layer of aluminum arsenide (AlAs) and an epitaxial layer of gallium arsenide (GaAs). The layers constituting an exemplary one of the layer pairs are indicated by reference numerals 112 and 114, respectively. Aluminum gallium arsenide AlGaAs may alternatively be used instead of AlAs. Aluminum gallium arsenide AlGaAs with different fractions of Al may alternatively be used instead of GaAs and AlAs. The reflectivity of the DBR 110 is determined by the difference in refractive index between the materials of the alternating layers of the DBR and the number of layer pairs in the DBR.

These parameters, as well as others, can be varied to fabricate a DBR having specific properties.

A lower cavity spacer layer 120 is located over the DBR 110. In a VCSEL, a pair of cavity spacer layers, lower cavity spacer layer 120 and an upper cavity spacer layer 140, sandwich an active region 130. The cavity spacer layers are sometimes referred to as optical cavity spacer layers. The thickness of the cavity spacer layers is defined to optimize the optical mode and quantum well gain of the VCSEL, thereby providing the proper Fabry-Perot resonance, as is known in the art. An analogous structure is the separate confinement heterostructure (SCH) layers that sandwich the active region in an edge-emitting device. In the example shown, the material of lower cavity spacer layer 120 and upper cavity spacer layer is GaAs. The material of lower cavity spacer layer 120 may alternatively be gallium arsenide nitride (GaAsN). As a further alternative, lower cavity spacer layer 120 may be composed of a sub-layer of GaAs and a sub-layer of GaAsN.

Figure 1B:
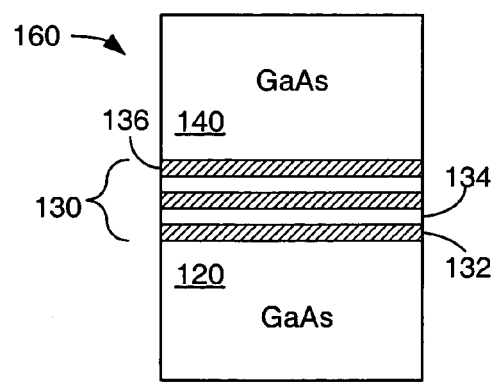
FIG. 1B is a schematic view illustrating the optical cavity of the VCSEL of FIG. 1A.

Active region 130 composed of quantum well layers of indium gallium arsenide nitride (InGaAsN) interleaved with barrier layers is located between lower cavity spacer layer 120 and upper cavity spacer layer 140. The material of the barrier layers may alternatively be gallium arsenide nitride (GaAsN). Referring briefly to FIG. 1B, embodiments in which the barrier layers are GaAsN typically have an additional barrier layer (not shown) of GaAsN between outermost quantum well layer 132 and lower cavity spacer layer 120 and an additional barrier layer (not shown) of GaAsN between outermost quantum well layer 136 and upper cavity spacer layer 140. References in this disclosure to gallium arsenide in connection with the barrier layers will be taken additionally to encompass GaAsN.

Returning now to FIG. 1A, a p-type DBR 150 is located over upper cavity spacer layer 140. In this example, DBR 150 is composed of approximately 25 layer pairs each composed of an epitaxial layer of AlAs and an epitaxial layer of GaAs. The material of one or both of the layers in each layer pair can alternatively be AlGaAs.

Hundreds or thousands of VCSELs, each similar to the VCSEL 100, are made from a layer structure fabricated by growing layers corresponding to the layers of VCSEL 100 on substrate 102 using organometallic vapor phase epitaxy (OMVPE). As noted above, OMVPE is often called metal organic chemical vapor deposition (MOCVD). In particular, in accordance with a first embodiment of the invention, the InGaAsN quantum well layers located in the active region 130 are grown in an OMVPE reactor at a sub-atmospheric elevated growth pressure. This will be described in more detail below with reference to FIG. 2. In accordance with a second embodiment of the invention, the InGaAsN quantum well layers are grown using a growth stop procedure in which epitaxial growth is stopped while the nitrogen precursor flows over the wafer. This "growth stop" process will be described in greater detail below with reference to FIGS. 6A through 6F.

FIG. 1B is a schematic view showing the optical cavity 160 of VCSEL 100 of FIG. 1A in more detail. In optical cavity 160, active region 130 has an InGaAsN quantum well layer 132 sandwiched between lower cavity spacer layer 120 and a barrier layer 134. Lower cavity spacer layer 120 provides one of the barrier layers for InGaAsN quantum well layer 132. InGaAsN quantum well layer, barrier layer 134 and lower cavity spacer layer 120 collectively form a quantum well. Alternating quantum well layers and barrier layers are located atop barrier layer 134 to provide additional quantum wells. Finally, upper cavity spacer layer 140 provides one of the barrier layers for InGaAsN quantum well layer 136.

Lower cavity spacer layer 120, upper cavity spacer layer 140, and active region 130 collectively constitute optical cavity 160 in which light generated by the recombination of carriers in the quantum wells of active region 130 and reflected between DBRs 110 and 150 passes back and forth until emitted through one of the DBRs. Depending on the direction of the desired light emission, one of the DBRs has a reflectivity slightly less than the other DBR, and the light is emitted from the VCSEL through the DBR having the lower reflectivity. In the example shown, the light is emitted through DBR 150, which has fewer layer pairs than DBR 110.

Figure 2A:
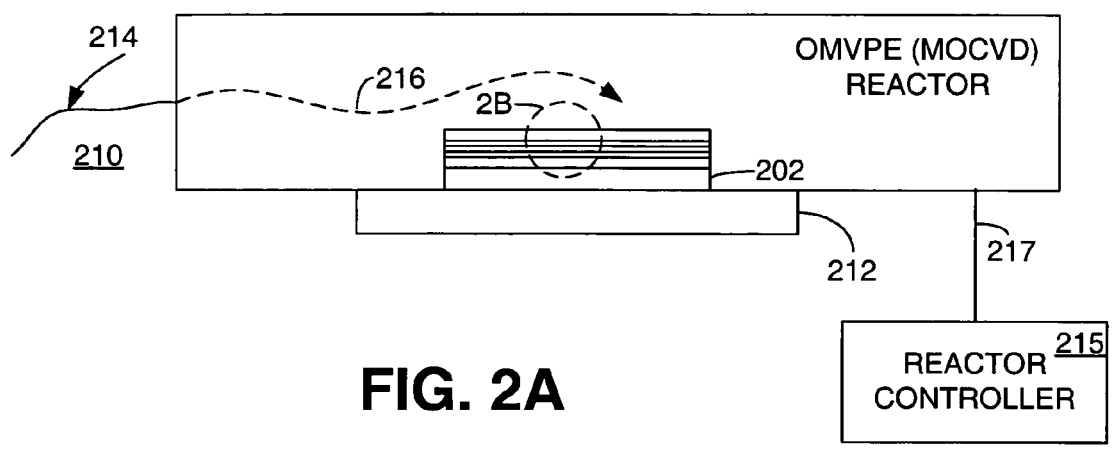
FIG. 2A is a schematic diagram illustrating an OMVPE reactor that can be used to perform embodiments of the method in accordance with the invention.

FIG. 2A is a schematic diagram 200 illustrating an OMVPE reactor 210 used to perform a method in accordance with embodiments of the invention. Many of the details of the OMVPE reactor are omitted to simplify the drawing, as these details are known in the art. A reactor controller 215 is coupled to reactor 210 via a connection 217. The reactor controller controls various operating aspects and parameters of reactor 210. As will be described below in greater detail, the reactor controller 215 is used to control, among other parameters, the growth pressure maintained in reactor 210 during epitaxial growth.

Located in reactor 210 is a susceptor 212 that has a heated surface on which is mounted a crystalline substrate wafer 202 on whose major surface epitaxial growth will take place. The material of the susceptor is typically graphite, silicon carbide, or molybdenum. During OMVPE epitaxial growth in reactor 210, a carrier gas is bubbled through constituent liquid precursors (not shown) to form a saturated precursor vapor for each constituent element of the material being epitaxially grown. The saturated precursor vapors are then diluted with additional carrier gas, as known in the art. The precursor vapors are transported towards the reactor by the carrier gas and are mixed to form a single flow of precursor vapors for introduction into the reactor. In the reactor, the precursor vapors pass over the major surface of the heated substrate wafer. This pyrolizes the precursor vapors, causing them to yield their respective constituent atomic elements. The elements deposit on the exposed surface of the heated substrate wafer, where they bond to the underlying crystal structure to form an epitaxial layer.

Some precursors, e.g., nitrogen trifluoride, are gases. In this case, the flow of the gaseous precursor is simply diluted with the carrier gas before being mixed with the other precursor vapors.

In the example shown in FIG. 2A, a quantum well layer of InGaAsN is grown by supplying precursor vapors 214 for arsenic, nitrogen, gallium and indium to reactor 210. The precursor vapors are diluted with a carrier gas. In one embodiment, the arsenic precursor was arsine ($AsH_3$), the nitrogen precursor was dimethylhydrazine (DMHy), the gallium precursor was trimethylgallium (TMGa, $(CH_3)_3Ga$), the indium precursor was trimethylindium (TMIn, $(CH_3)_3In$) and the carrier gas was hydrogen ($H_2$).

Other precursors can additionally or alternatively be used. Examples of suitable arsenic precursors include, but are not limited to, tertiarybutylarsine, trimethylarsenic, phenylarsine, trisdimethylaminoarsine, triethylarsenic, monoethylarsine and diethylarsenic hydride. Examples of suitable nitrogen precursors include, but are not limited to, hydrazine, phenylhydrazine, ammonia, tertiarybutylamine, nitrogen trifluoride and excited nitrogen. More than one of the arsenic precursors or more than one of the nitrogen precursors can be used at the same time. An alternative carrier gas is nitrogen ($N_2$).

The carrier gas is bubbled through the precursor for each element of the material being formed. For example, to grow InGaAsN, the carrier gas is bubbled through a precursor for each of indium, gallium, arsenic and nitrogen. The resulting precursor vapors are subsequently combined into a mixture of precursor vapors having the appropriate concentrations of the constituent elements, and the mixture flows into OMVPE reactor 210. To achieve optimum layer thickness, composition uniformity and interface abruptness, the mixture of precursor vapors it typically further diluted with additional carrier gas to increase the flow velocity.

To fabricate VCSEL 100 shown in FIG. 1A, DBR 110, lower cavity spacer layer 120, active region 130, upper cavity spacer layer 140 and DBR 150 are grown in order on substrate wafer 202 in reactor 210. In the example shown, the InGaAsN quantum well layers and barrier layers are grown on lower cavity spacer layer 120 (FIG. 1B) as will be described below with reference to FIG. 2B. In the exemplary VCSEL shown, the material of substrate wafer 202 is GaAs. Lower cavity spacer layer 120, upper cavity spacer layer 140 and DBRs 110 and 150 grow lattice matched on substrate wafer 202 of GaAs. Alternatively, in an edge-emitting laser, AlGaAs cladding layers grow lattice matched on substrate wafer 202 of GaAs.

The InGaAsN material of the quantum well layers has a bulk lattice constant larger than that of the GaAs material of lower cavity spacer layer 120. This difference in bulk lattice constants subjects the quantum well layers to a compressive strain, referred to as biaxial compression.

In accordance with the operation of OMVPE reactor 210, the precursor vapors flow into the OMVPE reactor, as indicated by arrow 216 and pass over the surface of heated substrate wafer 202. As the precursors vapors pass over substrate wafer 202, they are decomposed by pyrolysis and/or surface reactions. This releases the constituent atomic species onto the surface of the substrate wafer. These species settle on the heated surface of substrate wafer 202, where they bond to the underlying crystalline structure. In this manner, epitaxial growth occurs in OMVPE reactor 210.

Figure 2B:
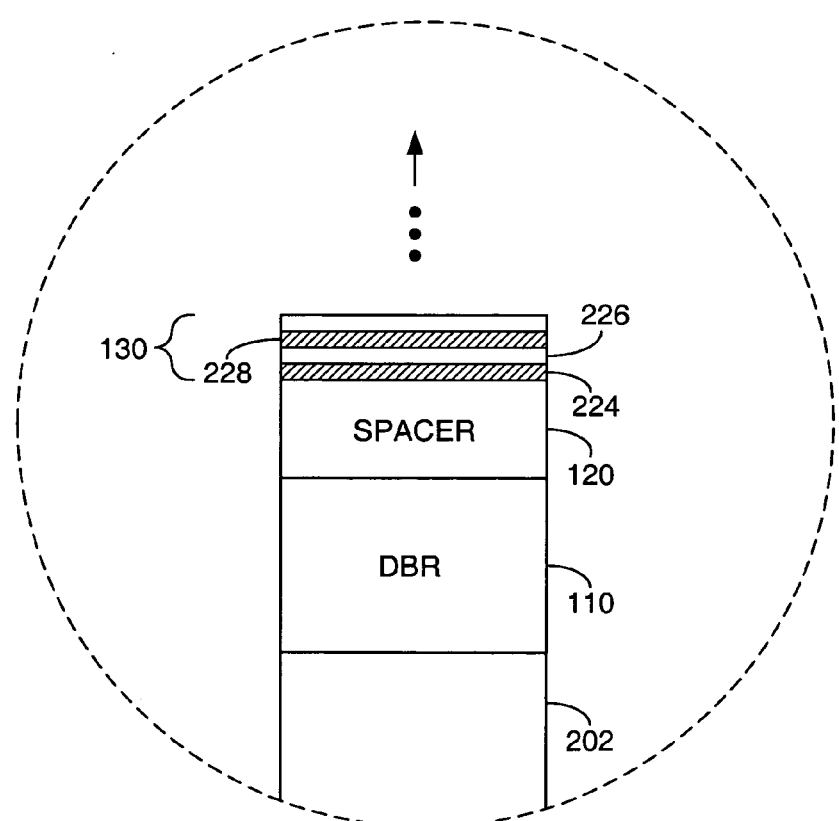
FIG. 2B is a detailed view of the partially-fabricated VCSEL shown in FIG. 2A.

FIG. 2B is a detailed view of VCSEL 100 shown in FIG. 2A part-way through the process of growing the layer structure. The epitaxial layers that form DBR 110 and lower cavity spacer layer 120 have been deposited on substrate wafer 202 by OMVPE at a conventional growth pressure, which is less than or equal to 100 mbar. After deposition of these layers, and in accordance with a first embodiment of the invention, the growth pressure in OMVPE reactor 210 is increased to a sub-atmospheric elevated growth pressure and active region 130 is then grown on lower cavity spacer layer 120. Increasing the growth pressure in the OMVPE reactor to a sub-atmospheric elevated growth pressure allows the InGaAsN quantum well layers to be grown with good electro-optical properties but with the flow rate of the arsenic precursor reduced relative to that used at a conventional growth pressure. The lower flow rate of the arsenic precursor increases the effective concentration of the nitrogen precursor in the flow of precursor vapors over the substrate wafer. This enables the InGaAsN material of the quantum well layers to incorporate a nitrogen fraction in the above-mentioned design range, i.e., from about 0.2% to about 5%. The elevated growth pressure allows a larger proportion of nitrogen to be extracted from the nitrogen precursor and deposited on the surface of the substrate wafer.

The growth pressure conventionally used in an OMVPE reactor is less than or equal to 100 millibar (mbar). However, in accordance with the invention, the growth pressure in OMVPE reactor 210 is increased to a sub-atmospheric elevated growth pressure of at least 100 mbar, and is typically increased to a sub-atmospheric elevated growth pressure of several hundred mbar. However, to maintain the quality of the materials grown, the elevated growth pressure is kept below atmospheric pressure (1000 mbar).

Growing the active region while maintaining a sub-atmospheric elevated growth pressure in OMVPE reactor 210 permits quantum well layers of InGaAsN incorporating a fraction of nitrogen in the above-mentioned design range to be grown in a continuous growth process. Maintaining a sub-atmospheric elevated pressure in OMVPE reactor 210 during growth of active region 130 reduces the flow rate of the arsenic precursor needed to produce material of a given electro-optical quality. Reducing the flow rate of the arsenic precursor increases the effective concentration of the nitrogen precursor in the flow of precursor vapors over the substrate wafer. The high concentration of the nitrogen precursor in the flow of precursor vapors increases the likelihood that nitrogen atoms will occupy the group-V lattice sites rather than arsenic atoms. In this manner, it is possible to produce a quantum well layer of InGaAsN with high electro-optical quality, and incorporating a relatively large fraction, as high as about 5%, of nitrogen.

As shown in FIG. 2B, a first InGaAsN quantum well layer 224 is grown on lower cavity spacer layer 120 while maintaining a sub-atmospheric elevated growth pressure in reactor 210. Lower cavity spacer layer 120 acts as one of the barrier layers of first InGaAs quantum well layer 224. A barrier layer 226 of GaAs is then grown over first InGaAsN quantum well layer 224. The sub-atmospheric elevated growth pressure is maintained while barrier layer 226 is grown. The process of alternately growing a quantum well layer and a barrier layer at a sub-atmospheric elevated growth pressure is repeated until the desired number of quantum well layers has been grown. Typically, all the InGaAsN quantum well layers and all the GaAs barrier layers are grown at the elevated, sub-atmospheric growth pressure and the supply of the indium precursor and the nitrogen precursor is alternately turned on and off to define quantum well layers and the barrier layers, respectively. Then, upper cavity spacer layer 140 is grown on the last quantum well layer. Upper cavity spacer layer 140 acts as one of the barrier layers for the last quantum well layer. DBR 150 is then grown on upper cavity spacer layer 140. Upper cavity spacer layer 140 and DBR 150 are typically grown at a conventional growth pressure.

As noted above, in embodiments in which GaAsN is used as the material of the barrier layers, a barrier layer (not shown) of GaAsN is first grown on GaAs lower cavity spacer layer 120 and InGaAsN quantum well layer 224 is grown on the GaAsN barrier layer (not shown) at a sub-atmospheric elevated growth pressure. Additionally, the last barrier layer (not shown) grown on the last quantum well layer is grown using GaAsN and is grown to the same thickness as the remaining GaAsN barrier layers. Typically, all the InGaAsN quantum well layers and all the GaAsN barrier layers are grown at the elevated, sub-atmospheric growth pressure, and the supply of the indium precursor is alternately turned on and off to define quantum well layers and the barrier layers, respectively. Upper cavity spacer layer 140 is then grown on the last GaAsN barrier layer, and DBR 150 is grown on the upper cavity spacer layer. Upper cavity spacer layer 140 and DBR 150 are typically grown at a conventional growth pressure.

The advantages of growing InGaAsN at an elevated, sub-atmospheric growth pressure will now be described. First, the effect of the partial pressure of the arsenic precursor on the electro-optical quality of GaAs will described. At an elevated growth pressure, the quantity of the arsenic precursor required to grow epitaxial material of a given electro-optical quality using OMVPE is reduced. For example, it is possible to grow GaAs of excellent optical and electro-optical quality (i.e., material with high internal quantum efficiency of radiative recombination) with a lower flow rate of the arsenic precursor when the growth is performed at the elevated growth pressure. The growth pressure is the sum of the partial pressures of the precursor vapors and the carrier gas in the gas flow over the substrate wafer and is the pressure that is maintained in reactor 210. The partial pressure of the arsenic precursor is an epitaxial growth parameter that is frequently expressed as the V:III ratio. The V:III ratio is directly proportional to the partial pressure of the arsenic precursor when growing GaAs. This analysis can easily be extended to quaternary compounds such as InGaAsN, as will be described below.

GaAs grown with an insufficient V:III ratio has a poor electro-optical quality that suggests that some minimum partial pressure of the arsenic precursor is desirable to suppress the formation of defects that limit the light-emission efficiency of the device. These defects may be arsenic vacancies, which are more likely to form under arsenic-deficient conditions. The Group V vacancy concentration tends to diminish as the concentration of the active Group V precursor species in the gas flow over the substrate wafer is raised. Thus, a threshold value exists for the partial pressure of the arsenic precursor for producing material of good electro-optical quality. While this threshold value depends somewhat on the growth conditions (growth rate, temperature, etc.) and reactor geometry, it is estimated that for growth of arsenides by OMVPE, an arsenic precursor partial pressure of at least 1 mbar provides material having excellent electro-optical properties, for example, an internal quantum efficiency of radiative recombination approaching 100%.

As the growth pressure is increased, the threshold partial pressure of the arsenic precursor is obtained with a decreased flow rate of the arsenic precursor. For example, a typical single-wafer reactor using arsine (AsH$_3$) as the arsenic precursor may have a carrier gas flow rate of several liters per minute. If growth is performed at a conventional growth pressure of 50 mbar, an arsine flow rate of about 50 standard cubic centimeters per minute (sccm) is needed to grow material having excellent electro-optical characteristics. This flow rate indicates an arsine partial pressure estimated to be ~1 mbar. However, if growth is instead performed at a growth pressure of 200 mbar, the arsine partial pressure threshold can be provided by a flow rate of only about 10 sccm.

The above-described lower arsenic precursor flow rate that can be used in OMVPE growth performed at an elevated growth pressure applies to other reactor geometries as well. For example, in a simple, single-wafer vertical reactor, using arsine as the arsenic precursor flow rate of only approximately 20 sccm is needed for growth at an elevated growth pressure of about 950 mbar, while a flow rate of 100 sccm is needed at a conventional growth pressure of 100 mbar. Both flow rates correspond to an arsine partial pressure of about 1–2 mbar.

The above-described advantages of performing epitaxial growth at an elevated growth pressure are obtained at the expense of a more difficult interface formation. However, in the context of growing InGaAsN, using an elevated growth pressure is especially advantageous because it allows the flow rate of the arsenic precursor to be reduced, which in turn allows increased nitrogen incorporation. Moreover, by using an elevated growth pressure no higher than that which produces material of good crystalline quality, as described above, material with a nitrogen fraction in the design range with good crystalline quality and a good interface quality is obtained. Such an elevated growth pressure is below atmospheric pressure.

A primary challenge in growing InGaAsN is realizing a very high vapor concentration of the nitrogen precursor, while still preserving a partial pressure of the arsenic precursor that is sufficient to grow the material with a high crystalline quality, i.e., material having an internal quantum efficiency of radiative recombination approaching 100%. Although the $[N]_{vapor}$ concentration in the gas flow over the substrate wafer is conventionally increased by reducing the flow rate of the arsenic precursor, this has conventionally produced material having poor electro-optical characteristics. However, by growing at an elevated growth pressure, the flow rate of the arsenic precursor can be reduced without incurring the penalty of reduced material quality because the elevated growth pressure maintains a partial pressure of the arsenic precursor consistent with growing material of high electro-optical quality. The resulting mixture of precursor vapors is very rich in the nitrogen precursor for enhancing the nitrogen content of the InGaAsN material, yet forms epitaxial material having excellent electro-optical characteristics.

The advantage of a lower flow rate of the arsenic precursor is especially clear when the nitrogen precursor is a liquid. The flow rate of the nitrogen precursor is limited when the nitrogen precursor is a liquid from which a vapor is generated by bubbling a carrier gas through it. Generally, the carrier gas flow through the bubbler should not exceed 500 sccm. Otherwise, the precursor vapor may no longer saturate the carrier gas. In addition, the bubbler temperature should be held at a temperature lower than room temperature to avoid condensation in the gas lines between the bubbler and reactor. These considerations dictate that the maximum flow rate of the nitrogen precursor be limited to:

$$f_{DMHy}^{maximum} \cong 500 \text{ sccm} \cdot \frac{163 \text{ mbar}}{400 \text{ mbar} - 163 \text{ mbar}} \approx 350 \text{ sccm}$$

This assumes a bubbler temperature of 20° C., at which the vapor pressure of the exemplary nitrogen precursor DMHy is 163 mbar, and a total bubbler pressure of 400 mbar.

The nitrogen fraction incorporated into the epitaxially-grown InGaAsN material increases as the nitrogen fraction in the precursor vapor flow increases. Thus, to maximize $[N]_{vapor}$, the above-calculated maximum flow rate of the nitrogen precursor bubbler is used with a flow rate of the arsenic precursor no higher than that which satisfies the above-mentioned partial pressure threshold for the arsenic precursor. In an example in which the arsenic and nitrogen precursors are arsine and dimethylhydrazine, the concentration of the dimethylhydrazine vapor $[N]_{vapor}$ is given by $f_{DMHy}/\{f_{DMHy}+f_{AsH3}\}$, where $f_{DMHy}$ and $f_{AsH3}$ are the flow rates of the dimethylhydrazine and the arsine, respectively.

Using the numerical examples set forth above gives, for a conventional growth pressure of 50 mbar (minimum AsH$_3$ flow rate=50 sccm) and an elevated growth pressure of 200 mbar (minimum AsH$_3$ flow rate=10 sccm):

$$[N]_{vapor}^{50\text{-}mbar} \cong \frac{350 \text{ sccm}}{350 \text{ sccm} + 50 \text{ sccm}} \approx 0.875$$

$$[N]_{vapor}^{200\text{-}mbar} \cong \frac{350 \text{ sccm}}{350 \text{ sccm} + 10 \text{ sccm}} \approx 0.972$$

The above example indicates that the elevated growth pressure significantly increases the concentration of the DMHy vapor in the gas flow over the substrate wafer while simultaneously maintaining a flow rate of arsine sufficient to grow material with excellent electro-optical quality.

Figure 3:
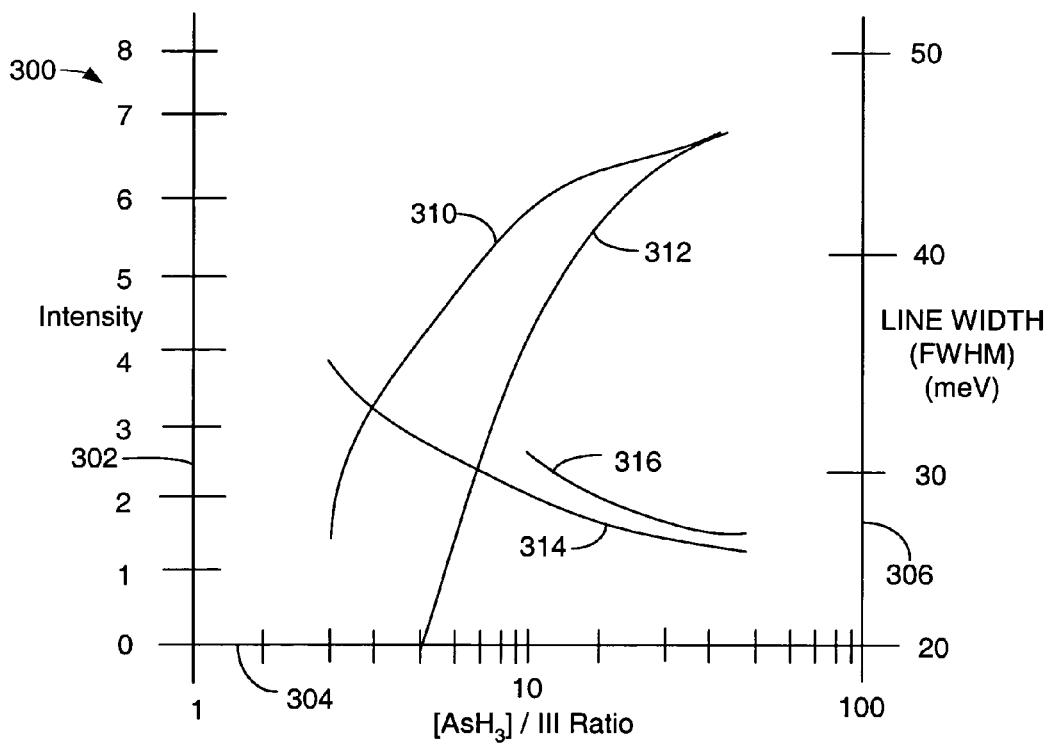
FIG. 3 is a graph comparing the photoluminescence intensity and line width of two InGaAs/GaAs quantum wells, one having an InGaAs quantum well layer grown at a conventional growth pressure of 100 mbar and the other having an InGaAs quantum well layer grown at an exemplary elevated growth pressure of 200 mbar.

FIG. 3 is a graph 300 comparing photoluminescence properties of two exemplary InGaAs/GaAs quantum wells, one in which the InGaAs quantum well layer was grown using OMVPE at a conventional growth pressure of 100 mbar and the other in which the InGaAs quantum well layer was grown using OMVPE at an exemplary elevated growth pressure of 200 mbar. The arsenic precursor was arsine in this example. This example illustrates the how the electro-optical quality of the quantum well depends on maintaining a minimum partial pressure of arsine in the reactor. FIG. 3 illustrates the effect of elevating the growth pressure and the consequent reduction of the arsine flow rate on the intensity and line width of the photoluminescence.

In FIG. 3, the left-hand vertical axis 302 represents the intensity of the photoluminescence, the right-hand vertical axis 306 represents the width, in millielectron volts (meV), of the spectral peak of the photoluminescence, i.e., the full width at half maximum (FWHM) of the spectral peak, and the horizontal axis 304 represents the ratio of arsine (AsH$_3$) to the Group III precursors in the gas flow over the substrate wafer. This ratio represents the absolute ratio of arsine (AsH$_3$) molecules to molecules of the Group III precursors in the gas flow. For example, an arsine (AsH$_3$) to Group III ratio of 10 indicates that the number of arsine (AsH$_3$) molecules in the gas flow is ten times that of the Group III precursor molecules. This ratio is also the atomic ratio of arsenic to the Group III atoms because each arsine molecule contains one arsenic atom and each TMGa and TMIn molecule contains one atom of gallium and indium, respectively.

The intensity of the photoluminescence of the InGaAs/GaAs quantum well represented by curve 310, in which the InGaAs quantum well layer was grown at an elevated growth pressure of 200 mbar, exceeds that of the InGaAs/GaAs quantum well represented by curve 312, in which the InGaAs quantum well layer was grown at a conventional growth pressure of 100 mbar. This relationship is true for arsine (AsH$_3$) to Group III ratios ranging from about two to about 80. Further, FIG. 3 shows that, at the growth pressure of 200 mbar, a given photoluminescence intensity and a given width of the spectral peak are obtained at a lower arsine to Group III ratio.

Similarly, the width of the spectral peak (indicated by curve 314) of the InGaAs/GaAs quantum well in which the InGaAs quantum well layer was grown at an elevated growth pressure of 200 mbar is narrower than that (indicated by curve 316) of the InGaAs/GaAs quantum well in which the InGaAs quantum well layer was grown at a conventional growth pressure of 100 mbar. Graph 300 clearly shows that raising the growth pressure from 100 mbar to 200 mbar reduces the arsine to Group III ratio, and, therefore, reduces the arsine flow rate, needed to grow an InGaAs/GaAs quantum well having a given electro-optical quality.

Figure 4:
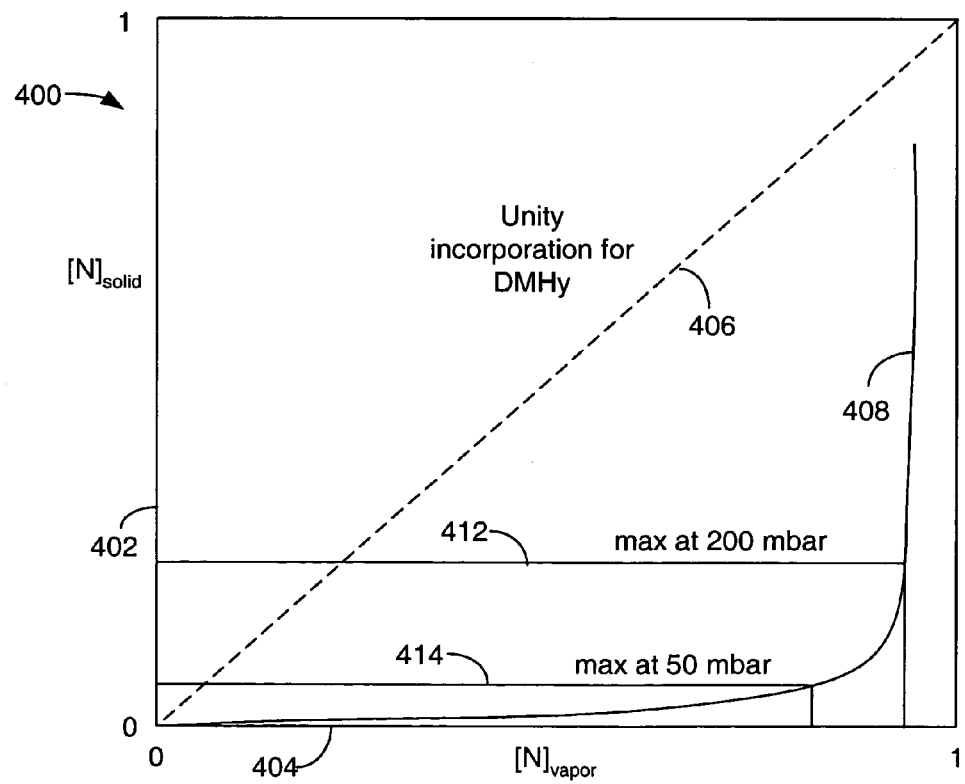
FIG. 4 is a graph showing the dependence of the fraction of nitrogen in an epitaxial layer on the concentration of the nitrogen precursor in the gas flow over the wafer.

FIG. 4 is a graph 400 showing the relationship (indicated by curve 408) between the fraction of nitrogen (N) incorporated in an epitaxial layer of InGaAsN, i.e., the value of y in InGaAs$_{1-y}$N$_y$, and the concentration of dimethylhydrazine in the gas flow over the wafer, i.e., the value of (DMHy/[DMHy+AsH$_3$]). In graph 400, the vertical axis 402 represents the fraction [N$_{solid}$] of nitrogen incorporated in the epitaxial layer of InGaAsN, while the horizontal axis 404 represents the concentration [N$_{vapor}$] of DMHy in the gas flow over the substrate wafer. The broken diagonal line 406 represents a nitrogen incorporation of unity in the epitaxial layer.

At an elevated growth pressure of 200 mbar, the arsine concentration in the gas flow over the substrate wafer can be reduced relative to that at a conventional growth pressure of 50 mbar. Therefore, at the elevated growth pressure of 200 mbar, a higher maximum concentration of DMHy can be obtained in the gas flow than at 50 mbar. The greater concentration of the nitrogen precursor in the gas flow over the substrate wafer at the elevated growth pressure of 200 mbar allows a substantially greater maximum nitrogen fraction to be incorporated in the epitaxial layer than that obtainable at the conventional growth pressure of 50 mbar. The maximum nitrogen fractions incorporated at growth pressures of 200 mbar and 50 mbar are indicated by lines 412 and 414, respectively.

The material growth considerations described above with reference to examples of arsine as the arsenic precursor and dimethylhydrazine as the nitrogen precursor also apply to the other precursors exemplified above. A high concentration of the nitrogen precursor is needed in the gas flow over the substrate wafer to obtain epitaxial material with a nitrogen fraction in the above-mentioned design range. Moreover, the partial pressure of the arsenic precursor should be maintained above a threshold value to ensure that the epitaxially grown layer of InGaAsN has good electro-optical properties. Growing the InGaAsN quantum well layers at a sub-atmospheric elevated growth pressure enables the threshold partial pressure of the arsenic precursor to be established at a lower flow rate of the arsenic precursor, regardless of the arsenic precursor used. The lower flow rate of the arsenic precursor allows the concentration of the nitrogen precursor in the gas flow over the substrate wafer to be increased, which in turn increases the maximum nitrogen fraction that can be extracted from the nitrogen precursor.

Figure 5A:
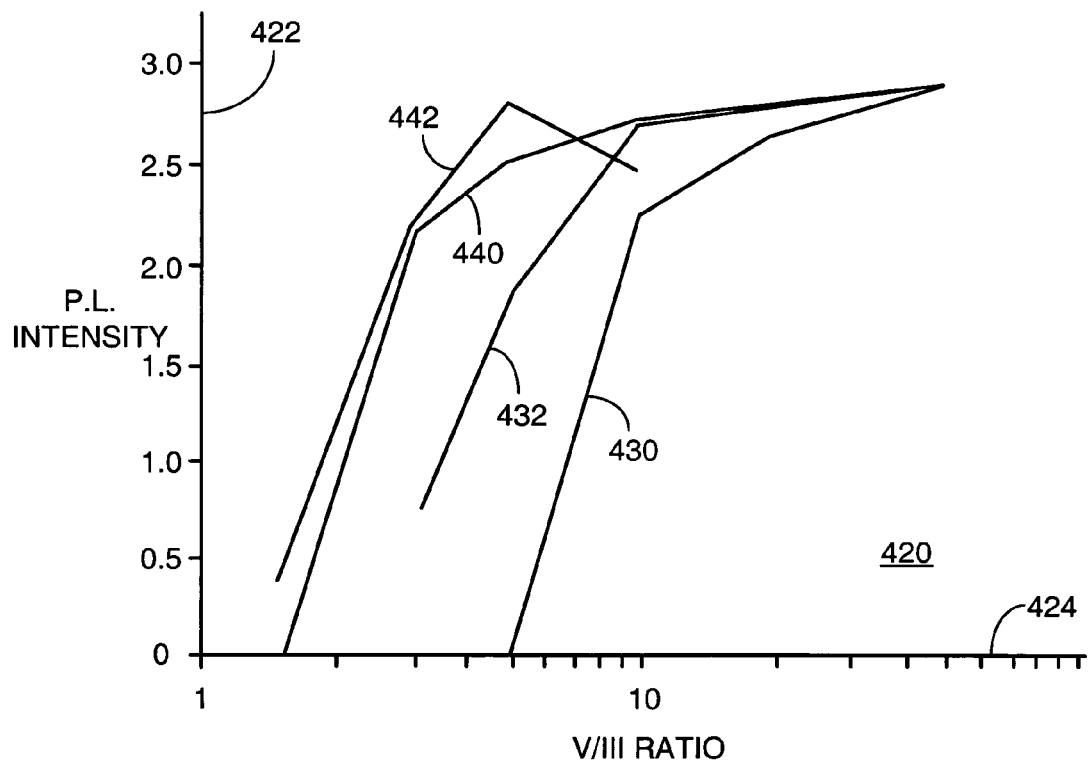
FIG. 5A is a graph showing the dependence on the V:III ratio of photoluminescence intensity and line width of exemplary InGaAs/GaAs quantum wells grown using arsine and TBAs as arsenic precursors.

Another arsenic precursor that has recently become available with a purity suitable for use in OMVPE is tertiarybutylarsine (TBAs). This material has been used in the above-described elevated pressure growth method to grow demonstration quantum well layers of InGaAs with excellent electro-optical properties. FIG. 5A is a graph 420 showing the dependence on the V:III ratio of the photoluminescence intensity and line width of exemplary InGaAs/GaAs quantum wells in which the InGaAs quantum well layer was grown at a growth temperature of 525° C. by OMVPE. This growth temperature is a typical growth temperature for InGaAsN and is lower than the growth temperature used for the other layers. The vertical axis 422 shows the intensity of the photoluminescence in arbitrary units and the horizontal axis 424 shows the V:III ratio on a logarithmic scale. Curves 430 and 432 show the intensity of the photoluminescence of quantum wells grown at a conventional growth pressure of 100 mbar and an exemplary elevated growth pressure of 200 mbar, respectively, with arsine as the arsenic precursor. Curves 440 and 442 show the intensity of the photoluminescence of quantum wells grown at growth pressures of 100 and 200 mbar, respectively, with TBAs as the arsenic precursor. For high V:III ratios, the intensity of the photoluminescence extrapolates to similar high values, regardless of the arsenic precursor used. Moreover, with TBAs as the arsenic precursor, a given photoluminescence intensity is obtained with a lower V:III ratio than with arsine as the arsenic precursor. It is thought that this is the result of TBAs being more efficiently pyrolized than arsine at the growth temperature used.

Figure 5B:
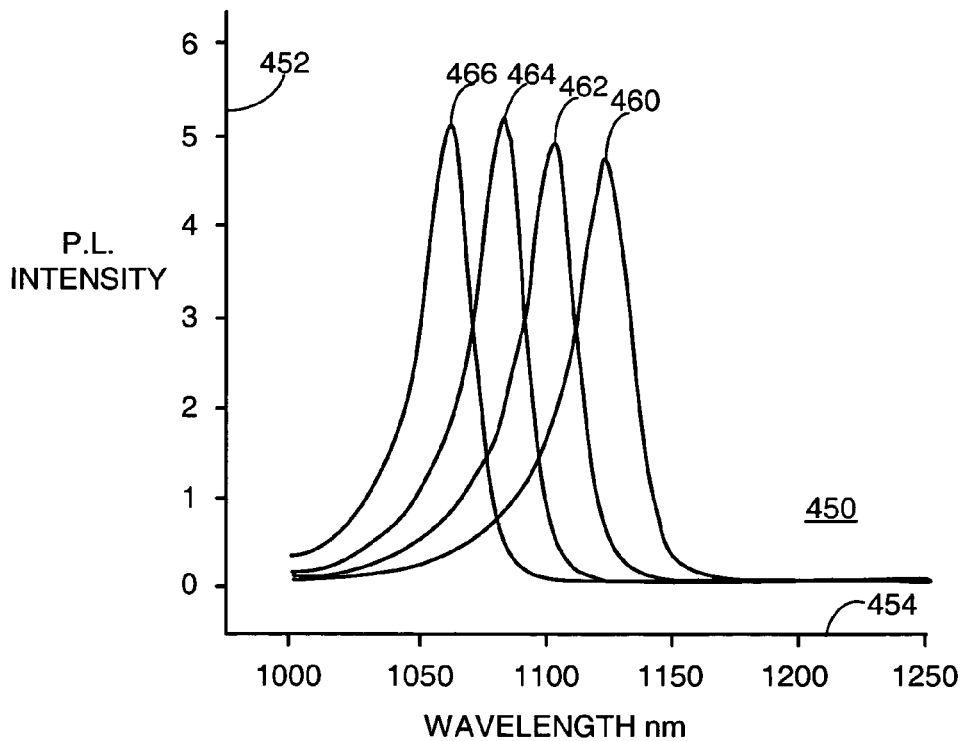
FIG. 5B is a graph showing the spectrum of the photoluminescence of InGaAs/GaAs quantum wells grown using TBAs as the arsenic precursor at four different growth rates.

FIG. 5B is a graph 450 showing the spectrum of the photoluminescence of InGaAs/GaAs quantum wells grown using TBAs as the arsenic precursor at four different growth rates. The vertical axis 452 shows the intensity of the photoluminescence in arbitrary units and the horizontal axis 454 shows the wavelength. In the examples shown, the indium fraction was about 41%. Curve 460 shows the spectrum of the quantum well grown at a nominal growth rate of about 0.1 nm/s at a growth temperature of 525° C. and a growth pressure of about 100 mbar. Curves 462, 464 and 466 show the spectra of the quantum wells grown at growth rates of one half, one third and one quarter of the nominal growth rate. The growth rate was determined by the flow rate of the Group III precursors. All the spectra depicted by curves 460, 462, 464 and 466 indicate that the growth process produced epitaxial material with excellent electro-optical properties. FIGS. 5A and 5B additionally show that TBAs may be used to grow InGaAs/GaAs quantum wells with an electro-optical quality comparable to that obtained with arsine. Adding a nitrogen precursor to the gas flow over the substrate wafer, increasing the growth pressure and decreasing the flow rate of the TBAs, as described above, incorporates nitrogen into the material of the quantum well layer and shifts the longest-wavelength peak (curve 460) to a wavelength greater than 1300 nm.

The nitrogen fraction that can be attained in the grown material and/or the elevation of the growth pressure can be reduced by using a nitrogen precursor with a high efficiency of incorporation. Reducing the elevation of the growth pressure to no more than that needed to grow the active region with a high electro-optical quality, as described above, advantageously increases the interface quality. Of the nitrogen precursors listed above, nitrogen trifluoride $NF_3$ has an incorporation efficiency greater than that of dimethylhydrazine and is additionally a gas. The high incorporation efficiency of $NF_3$ allows material with a given nitrogen fraction to be grown with less elevation of the growth pressure than such nitrogen precursors as DMHy. Moreover, $NF_3$ being a gas means that its maximum flow rate is not subject to the bubbler flow rate limitations referred to above.

Figure 6A:
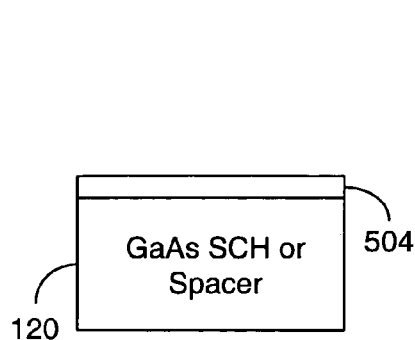
FIGS. 6A through 6F are schematic views illustrating an alternative embodiment of a method in accordance with the invention.

FIGS. 6A through 6F are schematic views illustrating a second embodiment of a method in accordance with the invention for epitaxially growing a quantum well layer of InGaAsN having a high nitrogen fraction. The quantum well layer is shown being grown on the surface of lower cavity spacer layer 120. DBR 110 (FIG. 1A) and lower cavity spacer layer 120 are grown on a substrate wafer 202 (FIG. 2A) as described above with reference to FIG. 2A. In FIG. 6A, an indium precursor, a gallium precursor, an arsenic precursor and a carrier gas have been supplied to an OMVPE reactor similar to that shown in FIG. 2A to grow a sublayer 504 on the surface of lower cavity spacer layer 120. The material of the sublayer is InGaAs and the sublayer has a thickness of one or two atoms.

Figure 6D:
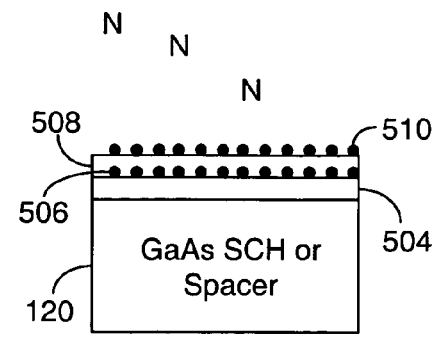
Figure 6B:
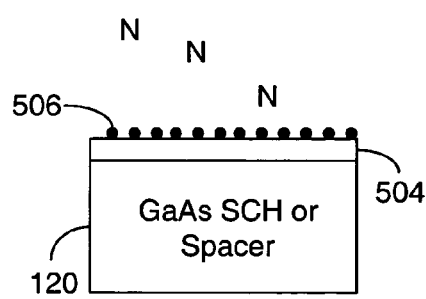

In FIG. 6B, a growth stop is performed. In the growth stop, the flow of the Group III precursors is discontinued. Additionally, the arsine flow rate is lowered and a high flow rate of a nitrogen precursor supplied to the reactor. This exposes the surface of sublayer 504 to gas flow having a very high concentration of the nitrogen precursor. The nitrogen atoms, an exemplary one of which is indicated by reference numeral 506, bond to the surface of sublayer 504.

Figure 6E:
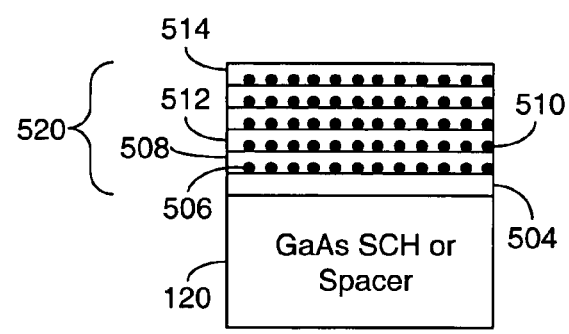
Figure 6C:
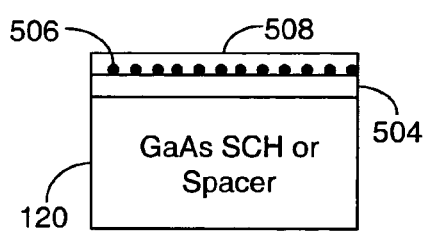

In FIG. 6C, the flow of the nitrogen precursor is discontinued, and the flow of the Group III precursors is resumed and the flow of arsine is restored to its original level. This resumes the growth of InGaAs, and an additional sublayer 508 of InGaAs is grown over nitrogen atoms 506 bonded to the surface of sublayer 504.

In FIG. 6D, another growth stop is performed, and the surface of sublayer 508 is exposed to a high flow rate of the nitrogen precursor. As described above with reference to FIG. 6B, nitrogen atoms 510 bond to the surface of sublayer 508.

A typical quantum well layer has a thickness of about 8 nm, corresponding to about 15 sublayers similar to sublayer 504. It is desirable to perform at least a few complete sublayer growth/nitrogen dose cycles in the course of growing each quantum well layer. In an embodiment, each InGaAsN quantum well layer is grown by performing eight sublayer growth/nitrogen dose cycles, although more or fewer sublayer growth/nitrogen dose cycles are possible.

In FIG. 6E, additional InGaAs sublayers are grown and each is dosed with nitrogen atoms during a subsequent growth stop, as described above, until quantum well layer 520 of InGaAsN is grown to within the thickness of one sublayer of its specified thickness. A final sub-layer 514 is then grown. The resulting InGaAsN quantum well layer 520 has a higher average nitrogen fraction than can be achieved using a conventional growth process.

Figure 6F:
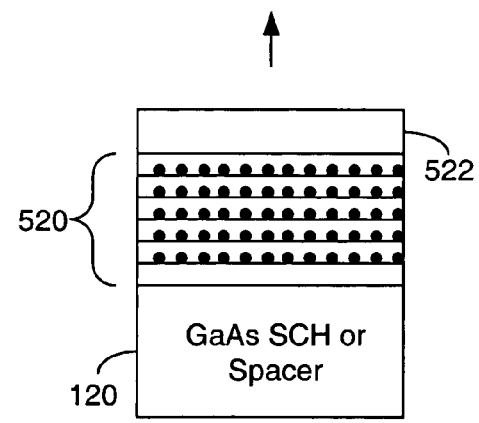

Finally, in FIG. 6F, the flow of the indium precursor is discontinued to grow a barrier layer 522 of GaAs on InGaAsN quantum well layer 520. The process just described is then repeated to form additional quantum wells.

FIGS. 6A through 6F show how an epitaxial layer of InGaAsN is grown with a high nitrogen fraction by repetitively performing a process of growing a sub-layer of InGaAs and then performing a growth stop during which the sublayer of InGaAs is dosed with a mixture of Group V precursors containing a very high concentration of the nitrogen precursor. In an embodiment, the duration of the growth stop was five seconds. Analysis of the resulting epitaxial material indicates that the material has a very high nitrogen fraction at the interface between the sublayers due to the dosing with nitrogen atoms 506 in the growth stop during which only the arsenic and nitrogen precursors and the carrier gas flowed over the substrate wafer. This embodiment of the method will grow an InGaAsN quantum well layer with a nitrogen fraction in the above-mentioned design range.

In another embodiment, because nitrogen bonds more readily to a GaAs surface than to an InGaAs surface, after each InGaAs sublayer is grown, the flow of the indium precursor is discontinued, and a monolayer of GaAs is grown. Then, during the growth stop, the surface of the GaAs monolayer is exposed to a flow of Group V precursors containing a very high concentration of the nitrogen precursor.

This produces an epitaxial layer of InGaAsN with a nitrogen fraction in the above-mentioned design range. Alternatively, the flow of the indium precursor is not stopped, but is significantly reduced immediately prior to the growth stop to reduce the indium fraction in the surface exposed to the nitrogen precursor.

During each growth stop, a dynamic equilibrium exists between absorption and desorption of arsenic from the crystal surface of the InGaAs sublayer. To stabilize the crystal surface against decomposition, the arsine flow is continued, but at a flow rate somewhat less than the flow rate required to provide the InGaAs sublayer with a high electro-optical quality. Consequently, during each growth stop, the arsine flow rate is reduced to increase the concentration of the nitrogen precursor in the flow of the Group V precursors. This enhances the incorporation of nitrogen on the surface of the sublayer.

The above-described process can be performed at a normal growth pressure or at an elevated growth pressure.

This disclosure describes the invention in detail using illustrative embodiments. However, the invention defined by the appended claims is not limited to the precise embodiments described.

We claim:

1. A method of making the active region of a long-wavelength light emitting device, the method comprising:
   providing an organometallic vapor phase epitaxy (OM-VPE) reactor;
   placing in the reactor a substrate wafer capable of supporting growth of indium gallium arsenide nitride;
   supplying to the reactor a Group III–V precursor mixture comprising an arsenic precursor, a nitrogen precursor, a gallium precursor, an indium precursor and a carrier gas;
   adjusting the flow rate of the arsenic precursor to grow an InGaAsN material having an internal quantum efficiency of radiative recombination approaching 100%; and
   pressurizing the reactor to a sub-atmospheric elevated growth pressure no higher than that at which a layer of indium gallium arsenide nitride having a nitrogen fraction commensurate with light emission at a wavelength longer than 1.2 µm is deposited over the substrate wafer.

2. The method of claim 1, in which the pressurizing comprises pressurizing the reactor to a sub-atmospheric pressure of at least 100 millibars.

3. The method of claim 2, in which the pressurizing comprises pressurizing the reactor to a sub-atmospheric pressure greater than 200 millibars.

4. The method of claim 1, wherein the adjusting comprises adjusting the flow rate of the arsenic precursor to provide a partial pressure thereof of approximately 1 millibar.

5. The method of claim 1, wherein the arsenic precursor comprises one of arsine, tertiarybutylarsine, trimethylarsenic, phenylarsine, trisdimethylaminoarsine, triethylarsenic, monoethylarsine and diethylarsenic hydride.

6. The method of claim 5, wherein the nitrogen precursor comprises one of hydrazine, dimethylhydrazine, phenylhydrazine, ammonia, tertiarybutylamine nitrogen trifluoride and excited nitrogen.

7. The method of claim 1, wherein the nitrogen precursor comprises one of hydrazine, dimethylhydrazine, phenylhydrazine, ammonia, tertiarybutylamine nitrogen trifluoride and excited nitrogen.

8. The method of claim 1, wherein the arsenic precursor consists essentially of tertiarybutylarsine.

9. The method of claim 8, wherein the nitrogen precursor consists essentially of dimethylhydrazine.

10. The method of claim 1, wherein the nitrogen precursor consists essentially of nitrogen trifluoride.

11. A method of making the active region of a long-wavelength light emitting device, the method comprising:
    providing an organometallic vapor phase epitaxy (OM-VPE) reactor;
    placing in the reactor a substrate wafer capable of supporting growth of indium gallium arsenide nitride;
    supplying to the reactor a Group III–V precursor mixture comprising an arsenic precursor, a gallium precursor, an indium precursor and a carrier gas;
    growing a sublayer of InGaAs;
    discontinuing supply of the Group III–V precursor mixture; and
    supplying to the reactor a Group V precursor mixture comprising an arsenic precursor and a nitrogen precursor in which the concentration of the nitrogen precursor exceeds that of the arsenic precursor.

12. The method of claim 11, wherein the nitrogen precursor comprises at least one of hydrazine, dimethylhydrazine, phenylhydrazine, ammonia, tertiarybutylamine nitrogen trifluoride and excited nitrogen.

13. The method of claim 11, wherein the arsenic precursor comprises at least one of arsine, tertiarybutylarsine, trimethylarsenic, phenylarsine, trisdimethylaminoarsine, triethylarsenic, monoethylarsine and diethylarsenic hydride.

14. The method of claim 11, additionally comprising, between the growing and the discontinuing:
    discontinuing supply of the indium precursor; and
    growing a monolayer of GaAs on the sublayer.

15. A method of making the active region for a long-wavelength light emitting device, the method comprising:
    providing an organometallic vapor phase epitaxy (OM-VPE) reactor;
    placing a substrate wafer in the reactor;
    supplying to the reactor a Group III–V precursor mixture comprising an arsenic precursor, a nitrogen precursor, a gallium precursor, an indium precursor and a carrier gas in which the concentration of the nitrogen precursor exceeds the concentration of the arsenic precursor; and
    pressurizing the reactor to a growth pressure of at least 100 millibars but less than 1000 millibars to grow a layer of indium gallium arsenide nitride.

16. The method of claim 15, wherein the substrate wafer consists essentially of gallium arsenide (GaAs).

17. The method of claim 15, wherein the pressurizing comprises pressurizing the reactor to a growth pressure no greater than that which ensures that a concentration of nitrogen commensurate with light emission at a wavelength longer than 1.2 µm is extracted from the nitrogen precursor and is deposited on the substrate wafer.

18. The method of claim 15, wherein the nitrogen precursor comprises one of hydrazine, dimethylhydrazine, phenylhydrazine, ammonia, tertiarybutylamine nitrogen trifluoride and excited nitrogen.

19. The method of claim 15, wherein the arsenic precursor comprises one of arsine, tertiarybutylarsine, trimethylarsenic, phenylarsine, trisdimethylaminoarsine, triethylarsenic, monoethylarsine and diethylarsenic hydride.

20. The method of claim 15, wherein the pressurizing comprises pressurizing the reactor to a growth pressure of greater than 200 millibars but less than 1000 millibars to grow the layer of indium gallium arsenide nitride.

21. A method of making the active region of a long-wavelength light emitting device, the method comprising:
    providing an organometallic vapor phase epitaxy (OM-VPE) reactor;

placing a substrate wafer in the reactor;
supplying to the reactor a Group III precursor mixture and a Group V precursor mixture, the Group III precursor mixture comprising a gallium precursor and an indium precursor, the Group V precursor mixture comprising an arsenic precursor and a nitrogen precursor; and
growing a layer of indium gallium arsenide nitride comprising a nitrogen fraction commensurate with light emission at a wavelength longer than 1.2 µm over the substrate wafer, the growing comprising minimizing the concentration of the arsenic precursor consistent with growth of material of high electro-optical quality by discontinuing the flow of the Group III precursor mixture and reducing the flow of the arsenic precursor during supply of the nitrogen precursor to the reactor, and by maximizing the concentration of the nitrogen precursor in the Group V precursor mixture.

22. The method of claim 21, wherein the minimizing the concentration of the arsenic precursor comprises pressurizing the reactor to a sub-atmospheric growth pressure of at least 100 millibar.

\* \* \* \* \*